United States Patent
Griffin et al.

(10) Patent No.: US 9,341,677 B1
(45) Date of Patent: May 17, 2016

(54) SYSTEM AND METHOD FOR DATA INPUT ALIGNMENT

(75) Inventors: Dan M. Griffin, Salt Lake City, UT (US); Scott C. Smedley, Salt Lake City, UT (US)

(73) Assignee: L-3 Communications Corp., New York, NY (US)

( * ) Notice: Subject to any disclaimer, the term of this patent is extended or adjusted under 35 U.S.C. 154(b) by 701 days.

(21) Appl. No.: 13/427,666

(22) Filed: Mar. 22, 2012

(51) Int. Cl.
*G01R 31/3183* (2006.01)
*G01R 31/3185* (2006.01)
*G01R 31/319* (2006.01)
G01R 31/40 (2014.01)

(52) U.S. Cl.
CPC .. *G01R 31/318558* (2013.01); *G01R 31/31922* (2013.01)

(58) Field of Classification Search
CPC ............... G01R 31/318558; G01R 31/318552; G01R 31/31922; G01R 31/31701; G01R 27/28; G01R 31/31937; H04L 25/14; H04L 1/242
See application file for complete search history.

(56) References Cited

U.S. PATENT DOCUMENTS

| | | | |
|---|---|---|---|
| 5,548,622 A * | 8/1996 | Ma .................................. | 375/354 |
| 6,351,827 B1 * | 2/2002 | Co et al. .......................... | 714/42 |
| 7,038,608 B1 * | 5/2006 | Gilbert ........................... | 341/144 |
| 7,362,800 B1 * | 4/2008 | Zerbe et al. .................... | 375/226 |
| 7,724,165 B2 * | 5/2010 | Lin et al. ........................ | 341/120 |
| 2002/0052998 A1 * | 5/2002 | Ito et al. ......................... | 710/305 |
| 2005/0028050 A1 * | 2/2005 | Ganry .............. | G01R 31/31725 714/700 |
| 2006/0109153 A1 * | 5/2006 | Gupta ............................ | 341/143 |
| 2006/0221723 A1 * | 10/2006 | Kang et al. ................ | 365/189.05 |
| 2008/0225141 A1 * | 9/2008 | Ogawa ........................... | 348/251 |
| 2009/0002082 A1 * | 1/2009 | Menolfi et al. ................... | 331/57 |
| 2009/0271674 A1 * | 10/2009 | Whetsel ......................... | 714/731 |
| 2011/0228105 A1 * | 9/2011 | Ito .............................. | 348/207.1 |

FOREIGN PATENT DOCUMENTS

GB       2344979 A   *   6/2000   ................ G06F 1/10

OTHER PUBLICATIONS

Sawyer, Data to Clock Phase Alignment, Xilinix, Feb. 18, 2008 (7 pages).

* cited by examiner

*Primary Examiner* — Cynthia Britt
*Assistant Examiner* — Dipakkumar Gandhi
(74) *Attorney, Agent, or Firm* — Brian Tucker; Kirton McConkie (57) ABSTRACT

A data alignment method is provided by iteratively increasing the delay of each data input line of a system component until a test signal transmitted on each data input line is received at the system component at substantially a predetermined time.

20 Claims, 8 Drawing Sheets

SYSTEM AND METHOD FOR DATA INPUT ALIGNMENT

BACKGROUND

In electronic circuits system, such as those constructed on electronic circuit boards, system components receive data that is transmitted and received on data lines connecting the various system components. After receiving data, system components can operate on or process the data. To coordinate the operation of each system component, one or more system clocks of the circuit system can send periodic clock signals to the system components. By coordinating each system component to a system clock, the operation of the system can be synchronized to prevent errors that may otherwise result from data that is transmitted, received or processed at an incorrect time.

Despite these efforts to coordinate circuit systems, data path delays in some data lines cause data sent through those data lines to become unsynchronized. Such data path delays have various causes, such as circuit board data path variations, material imperfections, capacitive coupling, temperature variations, voltage variations and process variations. When system components include multiple inputs, data path delays can result in signal skew, wherein input data arriving on different input lines is offset. Data skew is particularly problematic in circuit systems having high clock rates. For example, some modern circuit systems have a system clocks that may operates at about 2 to 4 gigahertz per second. At these clock rates, data path delays can result in data arriving at a destination component too late to be read in at the intended clock times. Some data may arrive too late when it fails to meet setup and hold requirements of the system component, resulting in a setup or hold violation. Setup violations occur when new data is not set up and stable before the next clock tick arrives. Hold violations occur when data is not held long enough at a destination to be properly clocked through. When a setup or hold violation occurs, new data may not be processed at the intended clock tick. Such violations means that data is not processed at the intended time, which can ultimately affects the accuracy and operation of the circuit system.

SUMMARY

In some embodiments, a method of aligning data inputs of a system component in an electronics system can include iteratively increasing the delay of each data input line of a system component until a test signal transmitted on each data input line is received at the system component at substantially a predetermined time.

In some embodiments, an electronics system can include a system component, a delay device, and a controller. The system component can have two or more data input lines, and the delay device can be coupled to each of the two or more data input lines. The controller can be coupled to the delay device of each of the data input lines and configured to iteratively increase the delay of each delay device until a test signal transmitted to the system component on each of the data input lines arrives at the system component at a predetermined time.

In some embodiments, a method of aligning data inputs of a DAC in an electronics system can include adding a delay to each data input line of the DAC, and transmitting the test signal along each data input line to the DAC. The method can also include determining if the test signal transmitted on each data input line arrived at the DAC at substantially the predetermined time, and increasing the delay of each data input line in which the test signal did not arrive at the DAC at substantially the predetermined time. The method can further include repeating the steps of transmitting, determining, and increasing until the test signal sent on each data input line arrives at the DAC at the predetermined time.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, the singular forms "a," "an," and "the" include plural referents unless the context clearly dictates otherwise. Thus, for example, reference to a terminal includes reference to one or more terminals. In addition, where reference is made to a list of elements (e.g., elements a, b, c), such reference is intended to include any one of the listed elements by itself, any combination of less than all of the listed elements, and/or a combination of all of the listed elements.

Numerical data may be expressed or presented herein in a range format. It is to be understood that such a range format is used merely for convenience and brevity and thus should be interpreted flexibly to include not only the numerical values explicitly recited as the limits of the range, but also as including all the individual numerical values or sub-ranges encompassed within that range as if each numerical value and sub-range is explicitly recited. As an illustration, a numerical range of "about 1 to 5" should be interpreted to include not only the explicitly recited values of about 1 to 5, but also include individual values and sub-ranges within the indicated range. Thus, included in this numerical range are individual values such as 2, 3, and 4 and sub-ranges such as 1-3, 2-4, and 3-5, etc. This same principle applies to ranges reciting only one numerical value and should apply regardless of the breadth of the range or the characteristics being described.

By the term "substantially" is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. As a particular example, in a digital electronics systems, two clock or other signal edges can be substantially time coincident when they are generated or triggered by a common event. The clock edges may not, however, be precisely aligned.

As used herein, the term "signal" refers to an electronic signal within a communications system. A signal can be a radio frequency signal propagating in free space or substantially confined within a signal path (e.g., a coaxial cable, waveguide, printed circuit board trace, internal wiring within an integrated circuit etc.). A signal can also be a digital signal or analog signal on a signal path. Digital signals can also be stored within digital circuits, for example in the form of particular bit patterns within a register, latch, memory, or the like. Signals can be converted between formats (e.g., between digital and analog, between stored and propagating, etc.) using various techniques (e.g., digital to analog converters, analog to digital converters, input buffers, output buffers, direct memory access controllers, etc.).

As used herein, the term "data" refers to digital information. Data can be, for example, user data to be transmitted over a communications link. As another example, data can be a transformed version of data. For example, a forward error correction encoder can take user data and add redundancy to produce encoded data. The encoded data is different from the user data, however the user data can be extracted (decoded) from the encoded data. Data can include multiple different user data streams multiplexed together.

Turning to the present invention, techniques for aligning data inputs transmitted on multiple data lines have been developed. These techniques can be implemented in a variety of circuits and circuit systems, which include one or more system components receiving data from multiple data lines.

Figure 1:
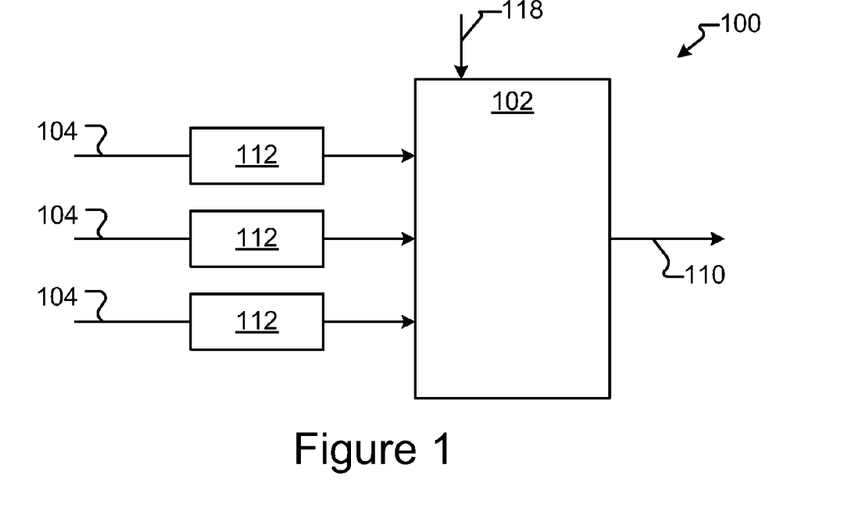
FIG. 1 is a block diagram of an electronics system in accordance with some embodiments of the present invention.

Turning to FIG. 1, a block diagram of an electronics system 100 is illustrated in accordance with some embodiments of the present invention. As depicted, the electronics system 100 includes a system component 102 having three data input lines 104 and a single data output line 110. A delay device 112 is coupled to each data input line 104. A clock input 118 is also coupled to the system component 102. In some embodiments, these component elements are included on a printed circuit board, integrated circuit, hybrid integrated circuit, or otherwise suitably formed as an operable circuit. Each of the foregoing component elements will now be discussed in greater detail.

The system component 102 can be an electronic component having a plurality of electrical terminals or leads. In printed circuit board embodiments, the electronic terminals of the system component 102 can be soldered to a printed circuit board (not shown). Two or more of the terminals can include data input lines that receive data from other components of the system 100. After the system component 102 operates on or processes input data, the output can be transmitted from one or more output lines 110. In some embodiments, the system component 102 is a digital-to-analog converter (DAC) having two or more data input lines 104 configured to accept digital signals from other components of the system 100 and convert these digital signals to an analog output signal. The analog signal can be transmitted out a single output line 110. Other non-limiting example of other system components 102 include processors, amplifiers, display devices, and other components having multiple data inputs. For simplicity, when describing a specific system component 102, this description will refer to a DAC, though it is understood that other such system component 102 can be utilized with the present electronics system 102. The system component 102 can be implemented using various devices including for example, a field programmable gate array (FPGA), application specific integrated circuit (ASIC), or software executing within a general purpose microprocessor.

It is contemplated that the system component 102 can have very few data input lines 104 to a very large number of inputs. For example, some representative system components 102 can have only two data input lines. Other representative system components 102 can have hundreds of data input lines. Accordingly, the number of data input lines can vary between approximately 2 to approximately 500, including data input lines ranging there between, such as between approximately 2 to approximately 20 data input lines, approximately 20 to approximately 50 data input lines, approximately 50 to approximately 100 data input lines, and approximately 100 to approximately 200 data input lines, etc.

Moreover, in some system configurations, data input lines 104 can be clustered into or comprise an input data bus having multiple individual data lines 104. For example, a representative input data bus can have 4, 6, 8, 10, 12, 14, 16, or more data input lines 104. Thus, in a non-limiting example of a DAC, the DAC can have four input data buses, each having 12 data lines, totaling 48 data input lines. Accordingly, the system component 102 can receive parallel data inputs and/or provide one or more parallel or serial data outputs.

Referring still to FIG. 1, as mentioned, in some instances, the data input lines 104 can deliver unsynchronized or offset signals and data to the system component 102 due to inherent data path delays. Such data path delays have various causes, such as data path variations, material imperfections, capacitive coupling, temperature variations, voltage variations and process variations. Accordingly, in some embodiments, alignment system and methods can be provided that can align the skewed data inputs of the system component 102. Such system can include providing a delay device 112 on each of the data input lines 104, respectively. These delays devices 112 can provide a delay to the arrival of data transmitted on each data input lines 104 so that data simultaneously arrives at the system component 102 from each data input lines 104.

In some configurations, the delay of each delay device 112 can be adjustable or programmable so that an individualized delay can be provided to each data input lines 104. Furthermore, the delay devices 112 can be configured to adjust the delay by fractions of a clock cycle of a system clock (such as 319 in FIG. 3). For example, a delay iteration can include 1/n clock cycle, wherein n is between 2 and 1000, such as a delay iteration of 1/16, 1/64, 1/128 or 1/256 of a clock cycle.

In some embodiments, the delay devices 112 can be configured to individually delay each respective data input line 104 so that a signal on each data input line 104 arrives at the system component 102 at approximately the same time. In this manner, the delay devices 112 can compensate for the specific line delay in each individual data input line 104. Moreover, the system 100 can be configured so that not only is input data synchronized, but that it is received at that system component 102 in time to meet the setup 202 and hold 204 time requirements of the intended clock tick 200 (shown in FIG. 2).

Figure 2:
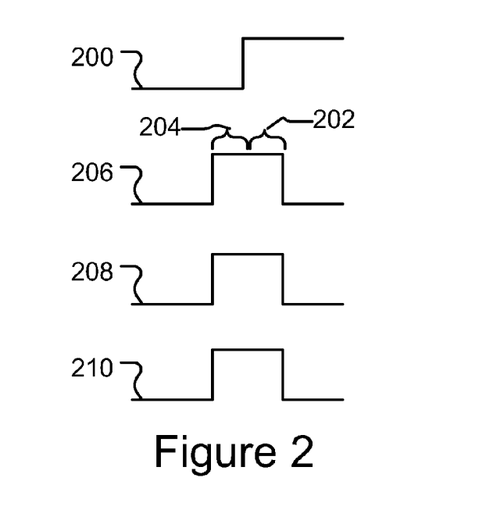
FIG. 2 is a timing diagram of data inputs and a clock signal in accordance with some embodiments of the present invention.

FIG. 2 provides an illustration of a clock signal 200 and three data input signal 206, 208, and 210. These data input signals may correspond to separate data inputs received on data input lines, e.g., data input lines 104 of FIG. 1. The signal value is shown in a vertical direction as a function of time on the horizontal direction (the earliest time being on the right, the later time being on the left). This figure illustrates three aligned input signals 206, 208 and 210 and illustrates the relative setup 202 and hold 204 time requirements for clocking in the signals 206, 208, and 210 into the system component 102 during the intended clock tick 200.

As shown, the setup requirement is the requirement of new data to become stable before a clock tick arrives. Some input digital signals include a solid high signal (e.g., a digital 1) and a solid low signal (e.g., a digital 0). When transitioning from a solid low signal to a solid high signal, the signal may have a metastable range wherein the signal vacillates between a high and a low signal, before it settles on a solid high. The setup requirement is the requirement of the signal to reach a solid high within a setup time 202 before the signal can be clocked in. In some instances, the metastable range has been found to take up approximately ⅕ of the period of a single pulse signal. The hold requirement requires that the signal be stable long enough (e.g. for a hold time 204) at the destination system component 102 to be properly clocked in. Thus, embodiments of the system 100 can both align data inputs and ensure that they are properly clocked in.

Figure 3:
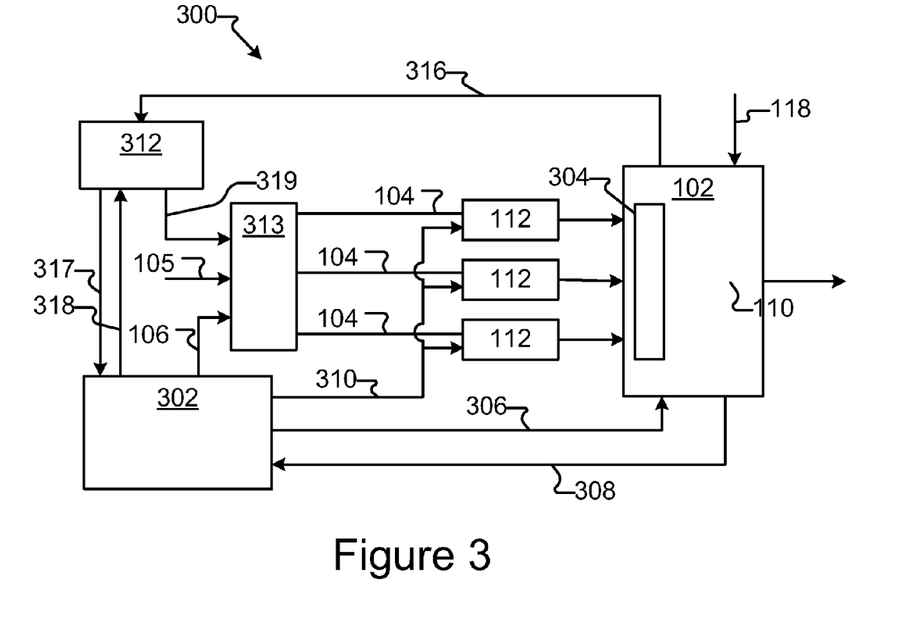
FIG. 3 is a block diagram of another electronics system in accordance with some embodiments of the present invention.

Turning now to FIG. 3, a block diagram of an alignment system 300 is illustrated in accordance with some embodiments of the present invention. As depicted, the electronics system 300 includes a system component 102 having three data input lines 104 and a single data output line 110. A delay device 112 is coupled to each data input line 104. The system component 102 includes a clock input 118. The system component 102 provides a clock output 316 to another system component, such as a voltage controlled oscillator (VCO) 312. This clock output 316 can be a divide of the input clock 118. The clock output 316 can act as the reference clock from which some or all of the data alignment control process is referenced. Furthermore, a controller 302 is coupled to each delay device 112 via a delay adjustment line 310. The controller 302 is also coupled to the system component 102 via a scan enable line 306 and a scan output line 308. System component 102 includes an internal register 304. The system component 102 is connected to a voltage controlled oscillator (VCO) 312 via clock line 316. The system controller 102 and the VCO 312 are each connected to a test pattern component 313. Each of the foregoing component elements will now be discussed in greater detail, with the exception that a description of the components described with reference to FIG. 1 will not be duplicated.

First, the controller 302 is coupled to the delay devices 112 and thus indirectly to the data input lines 104. The controller 302 can also be coupled to a scan enable line 306 and scan output lines 308 of the system component 102. The controller 302 can receive a scan clock signal transmitted on the clock line 317 from the VCO 312 that enables it to send the scan enable signal and receive in response the scan in data, while meeting the setup and hold time of these signals. The system controller 302 can control the phase of the clock signal on clock line 317, which can be locked to the clock signal on line 316. The controller 302 can also control the phase of the clock transmitted on the clock line 319 driving the test pattern component 313. The test pattern component 313 can transmit a test pattern along the data input lines 104 under the control of the controller 302, via control line 106, or another component. This can be done via the control line 318. The controller 302 can also provide test data to test pattern component 313 for the bit alignment process. After alignment operation data, which can be initiated via a signal transmitted on alignment line 105, is sent onto lines 104 for normal data operation. Thus connected, the controller 302 can control various processes of the alignment system 300.

For instance, the controller 302 can be configured to iteratively increasing the delay of each delay device 112 until a signal transmitted simultaneously to the system component 102 on each of the data input lines 104 arrives at the system component 102 at substantially a predetermined time. The controller 302 can also delay the phase of clock, transmitted on the clock line 319, which delays the entire set of test data in test pattern component 313 going to lines 104. This phase delay can have a much finer resolution that the delay elements in 112. However, this delay can affect all data input lines 104 the same amount. This iterative process can initially involve the controller 302 setting the delays of each of the delay devices 112 to zero, then advancing the clock phase on the clock line 319, until the test data is registered in the register 304 at a predetermined time. Then, the controller 302 can iteratively increase the delay of the delay device 112 of each of the remaining data input lines 104 until a test signal sent on each line arrives at the system component at a predetermined time. Once each of the data input lines 104 is appropriately delayed, test signals sent on each data input line 104 will be synchronized, removing data skew.

Various ways of implementing the controller 302 can be used. For instance, the controller 302 can be implemented using various components including for example, a field programmable gate array (FPGA), application specific integrated circuit (ASIC), or software executing within a general purpose microprocessor.

As mentioned, the controller 302 can be coupled to the system component 102 via a scan enable line 306 and a scan output line 308. These lines can enable the controller 302 to retrieve information from a register 304 of the system component 102. For example, when a scan enable signal is transmitted to the system component 102 from the controller 302, the system component 102 can be configured to output the data in the register 304 on the scan output line 308. More specifically, the register 304 can be configured to record data received from each of the data input lines 104 during a single clock tick and then output that data along the scan output line 308 when a scan enable signal is received. Thus configured, the controller 302 can receive data recorded in the register 304 from each of the data input lines 104 during a single clock tick. As will be described below in greater detail, the controller 302 can thus increase the delay of each delay device 112 until a signal transmitted on each data input line 104 arrives at the system component 102 in time to be clocked into the register 304 at a predetermined clock tick.

Referring still to FIG. 3, the system 300 can provide various test signals to the system component 102 for use during system alignment. For instance, the controller 302 can transmit a signal having a predetermined pattern, such as pulse signal, on each of the data input lines 104 by loading this data into test pattern component 313. Furthermore, the VCO 312, or other such device, can receive a clock signal on clock line 316 from which a reference clock signal is produced and transmitted along clock line 317 and another clock signal is produced and transmitted on the clock line 319. The production and control of these signals in the VCO 312 can be governed by the system comptroller 302 via control line 318.

During system alignment, a test signal, stored in test pattern component 313 as described above, can be repeatedly transmitted to the system component 102 along the data input lines 104. The test signal can be designed to arrive at the system component 102 at approximately a clock tick before a predetermined time. This timing is determined and/or tested in light of inherent line delays, but without any added delay from the delay devices 112 or the VCO phase offset via clock line 319. Under these conditioned, if the test signal arrives at the system component 102 during or after the predetermined time, the timing of the test signal or the predetermined time can be adjusted.

After the test signal arrives at the system component 102, the controller 302 can determine if the test signal arrived at the predetermined time. This can be done by determining if the register 304 recorded the test signal during a predetermined clock tick. For example, in some embodiments, when the test signal arrives at the system component 102, it can be recorded in the register 304 of the system component 102. The register 304 can record the data received on each individual data input lines 104 during a single clock tick of the system clock. The information recorded in the register 304 can be updated during each clock tick. Accordingly, the controller 302 can send a scan enable signal to the system component 102 at the appropriate time to receive data, via the scan output line 308, recorded in the register 304 during the predetermined clock tick. When the scan enable signal goes high, the data clocked into the register 304 can be held and shifted out the scan input 308 to the system controller 302. The controller 302 can be configured to use this information to determine if the test signal was received during the predetermined clock signal. For instance, if the test signal is a pulse signal, for example, a digital 1 surrounded by leading and trailing digital 0s, the controller 302 can determine if the pulse, the 1, was recorded on any of the data input lines 104.

As mentioned, when the delay devices 112 provides no delay to the data input lines 104 and the clock line 319 has no delay, the test signal is registered at a time before the predetermined clock tick. Accordingly, initially, the controller 304 may determine that the test signal received from each of the data input lines 104 did not arrive at the predetermined time. The controller 302 can then be configured to add a phase offset to the signal on the clock line 319 until the data line 104 having the longest inherent delay registers the test signal. At that point, the delay of the delay devices 112 of the remaining data lines 104 is increased until a test signal transmitted on those lines is also registered.

After the delay is added to each delay device 112, a subsequent test signal can be again transmitted to the system component 102 and the controller 302 can again determine if the test signal arrived at the system controller 102 on any of the data input lines 104 at the predetermined time. The controller 302 can be configured to increase the delay of each delay device 112 of a data input line 104 in which the transmitted test signal did not arrive at the system component 102 at the predetermined time. This process can be repeated until the test signal transmitted on each data input line 104 is received at the system component at the predetermined clock tick. In this way, each data input line 104 is delayed individually until a signal transmitted on each data input line arrives at the same time, which can eliminate data skew.

In some embodiments, the controller 302 can determine that the test signal arrived at the predetermined time when it is clocked into the register 304 at the predetermined time as a stable signal. Accordingly, to be clocked in, the test signal may be required to meet the setup and hold requirements of the register 304. Thus, after a stable test signal is registered on any one or more data input lines 104, the controller 302 determining that the test signal arrived at the predetermined click tick and can cease to add a delay to the delay device 112 of those one or more data input lines 104.

Reference will now be made to FIGS. 4-7, which provide signal illustrations of the aforementioned alignment process. These Figures illustrate a clock signal 200 and three data input signal 206, 208 and 210. The clock signal 200 includes a rising clock tick 400. The timing of this rising clock tick 400 is continued downward, for explanation purposes, as a dotted line that crosses over the other data input signals 206, 208 and 210. Similar to FIG. 2, the signal value of the data input lines 206, 208, and 210 are shown in a vertical direction as a function of time on the horizontal direction (the earliest time being on the right, the later time being on the left).

Figure 4:
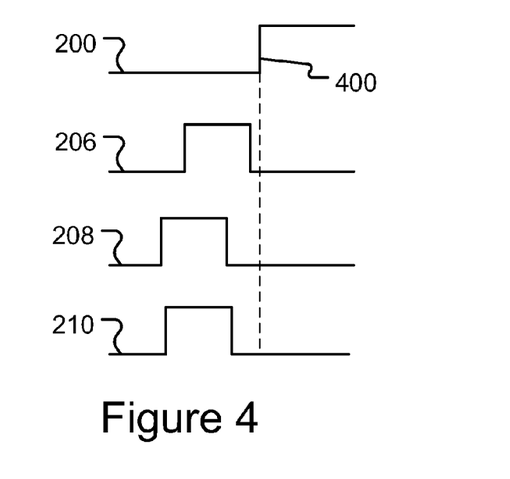
FIG. 4 is a timing diagram of inputs being received in a system component of the electronic system in accordance with some embodiments of the present invention.

Turning first to FIG. 4, this Figure illustrates three test signals 206, 208 and 210. These test signals 206, 208 and 210 may correspond to separate inputs received at the system component 102 on separate data input lines, e.g., data input lines 104 of FIG. 1. The test signal is shown as a pulse test signal, such as a single or multi-bit digital pulse signal. Various other forms of test signals can be used. In some configurations, each of the test signals 206, 208, and 210 is transmitted simultaneously, but arrives at different times due to inherent line delays (as opposed to the programmable line delays 112). As shown, the inherent line delays result in the test signals 206, 208, and 210 arriving at the system component 102 offset, resulting in signal skew at the system component 102. For instance, test signal 206 is delayed more than the other test signals 208 and 210, with signal 208 being the least delayed. As mentioned, these delays can be caused by line delays inherent in the system 300. As shown, the rising clock tick 400 is a predetermined time or predetermined clock tick used to align the data input lines. Accordingly, the test signals 206, 208 and 210 can be configured to arrive at the system component 102 before a predetermined clock tick 400 when no delay is added in the data input lines from the delay devices 112.

Figure 5:
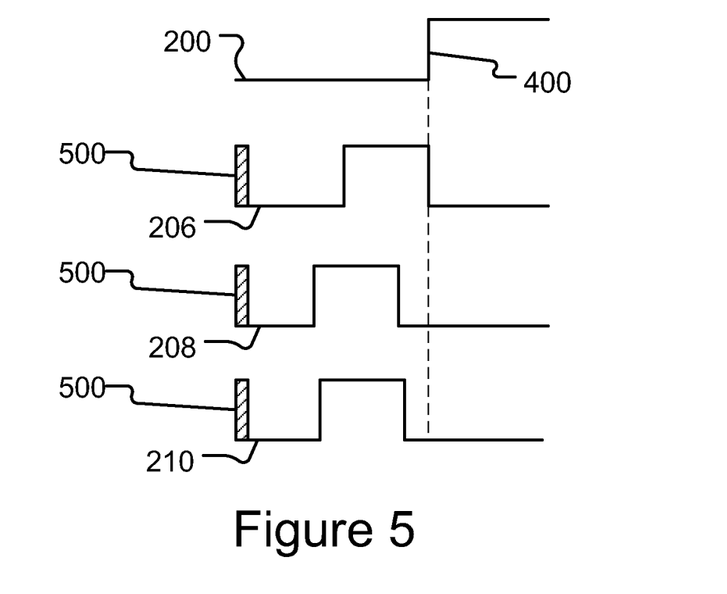
FIG. 5 is a timing diagram of delayed inputs being received in a system component of the electronic system in accordance with some embodiments of the present invention.

FIG. 5 illustrates the same test signals 206, 208 and 210 transmitted over the same data input lines 104 but having an added delay 500 from delay devices 112 or clock line 319. This Figure illustrates a step of the iterative process of transmitting a test signal on the data input lines 104 while iteratively increasing the clock phase delay or the delay of devices 112. As shown, the added delay 500 causes the test signals 206, 208 and 210 to arrive at the system component 102 later than they arrived without the delay (as shown in FIG. 4). For instance, test signal 206 was sufficiently delayed such that its trailing edge was present in the register 304 during the rising clock edge 400. For purposes of the examples of FIGS. 5-7 the setup and hold requirements of the register 304 will be assumed as being met when any portion of the test signals 206, 208 and 210 are aligned with the rising clock edge 400 of the clock signal 200. It should be noted, that the delay of the test signals can cause the test signal data to be clocked while violating the setup and hold on the input 102. Additionally or alternatively, in some embodiments, each iteration of the alignment process is repeated several times (e.g., two, five, ten, or more times) to ensure that the test signal was in fact registered and the corresponding register value was in fact changed. In some embodiments, only when the register value is determined to have changed to the test value for each repetition of the iteration of the alignment process is it determined that the test signal is past the hold window of the input register 102.

As shown in FIG. 5, the test signal 206 arrived at the system component 102 at the predetermined clock tick 400 of the clock signal 200. At this point, the controller 302 can determine that this test signal 206 arrived at the system component 102 at the predetermined time. The controller 302 can thus identify that the data input line 104 on which the test signal 206 was transmitted does not need to be delayed any further during subsequent input alignment iterations.

Figure 6:
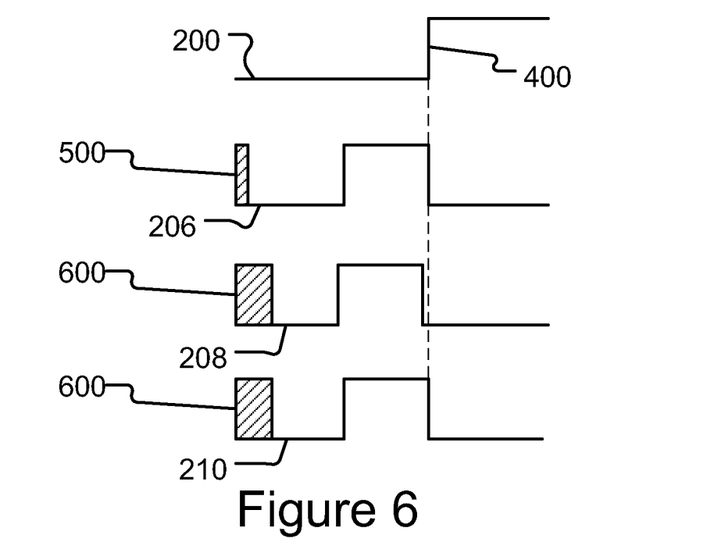
FIG. 6 is a timing diagram of delayed inputs being received in a system component of the electronic system in accordance with some embodiments of the present invention.

Accordingly, as shown in FIG. 6, the controller 302 can be configured to increase the delay of each delay device 112 of the data input lines 204 in which the test signals 208 and 210, since these test signals 208 and 210 did not arrive at the system component 102 at the predetermined clock tick 400. Thus, FIG. 6 illustrates the same test signals 206, 208 and 210 transmitted over the same separate data input lines 104, with the input lines on which test signals 208 and 210 are sent having an increased delays 600. As shown, the test signal 210 arrived at the system component 102 at the predetermined clock tick 400 of the clock signal 200. At this point, the controller 302 can identify that the data input line 104 on which the test signal 210 was transmitted, similar to that on which test signal 206 was transmitted, does not need to be delayed any further during subsequent input alignment iterations. At this point, the data input lines 104 on which the test signals 206 and 210 are transmitted are aligned.

Figure 7:
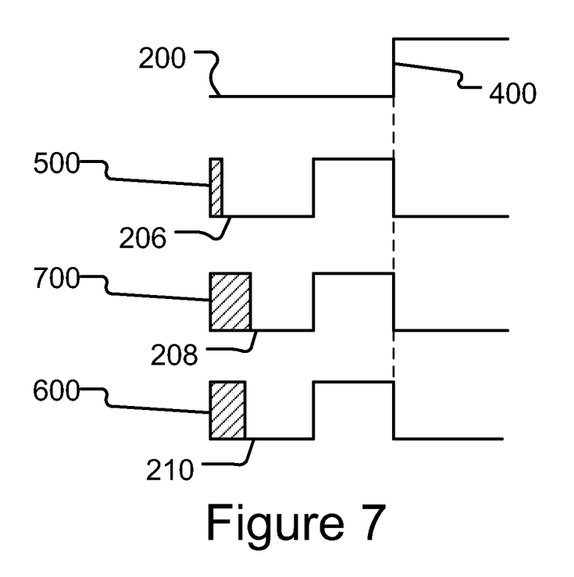
FIG. 7 is a timing diagram of delayed inputs being received in a system component of the electronic system in accordance with some embodiments of the present invention.

FIG. 7 illustrates the same test signals 206, 208 and 210 transmitted over the same separate data input lines 104, with the input lines on which test signals 208 are sent having an increased delays 700. The delays 500 and 600 on the data input lines 104 on which test signal 206 and 208 were not further increased. As shown, the test signal 208 was sufficiently delayed until it arrived at the system component 102 at the predetermined clock tick 400 of the clock signal 200. At this point, the controller 302 can identify that the data input line 104 on which the test signal 210 was transmitted, similar to that on which test signal 206 and 210 were transmitted, does not need to be delayed any further during subsequent input alignment iterations. At this point, each of the data input lines 104 on which the test signals 206, 208 and 210 are transmitted are aligned. This process can be continued if the system controller 302 includes additional data input lines 104 not represented in the figures. Alternatively, if there are no additional data input lines 104, the alignment process can be complete.

In some embodiments, the system 300 is configured to automatically run the alignment process each time that it is likely that line delay may change. Non-limiting examples of such times when the alignment process may be run include after a temperature change in the system, after a change in the waveform of the data inputs during normal system operation, during startup, at a periodic timing, such as daily or weekly.

Figure 8:
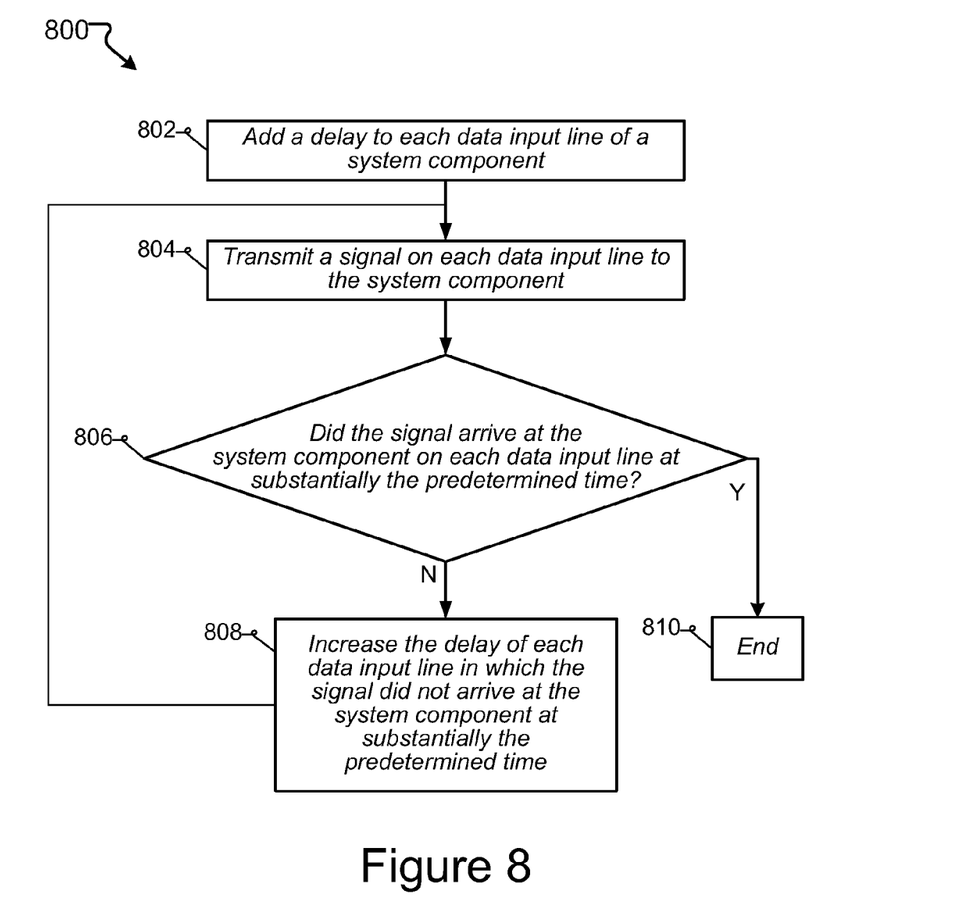
FIG. 8 is a flowchart of a method of aligning data inputs of a system component in accordance with some embodiments of the present invention.

In addition to the aforementioned alignment system embodiments, embodiments of the present invention further contemplate a method for aligning data inputs of a system component in an electronics system. Accordingly, FIG. 8 shows such a method 800. In step 802 of the method 800, a delay is added to each data input line (e.g., line 104) of a system component (e.g., 102). In step 804, a signal, such as a test signal (e.g., 206, 208, and/or 210), is transmitted on each data input line (e.g., 104) to the system component (e.g., 102). In step 806, it is determined if the signal arrived at the system component on each data input line at substantially a predetermined time. If the each signal did arrive at the system component arrive at the predetermined time, the method ends in step 810. However, if not, in step 808, the delay of each data input line in which the signal did not arrive at the system component at substantially the predetermined time is increased. Steps 804, 806 and 808 are repeated until the method is complete.

Figure 9:
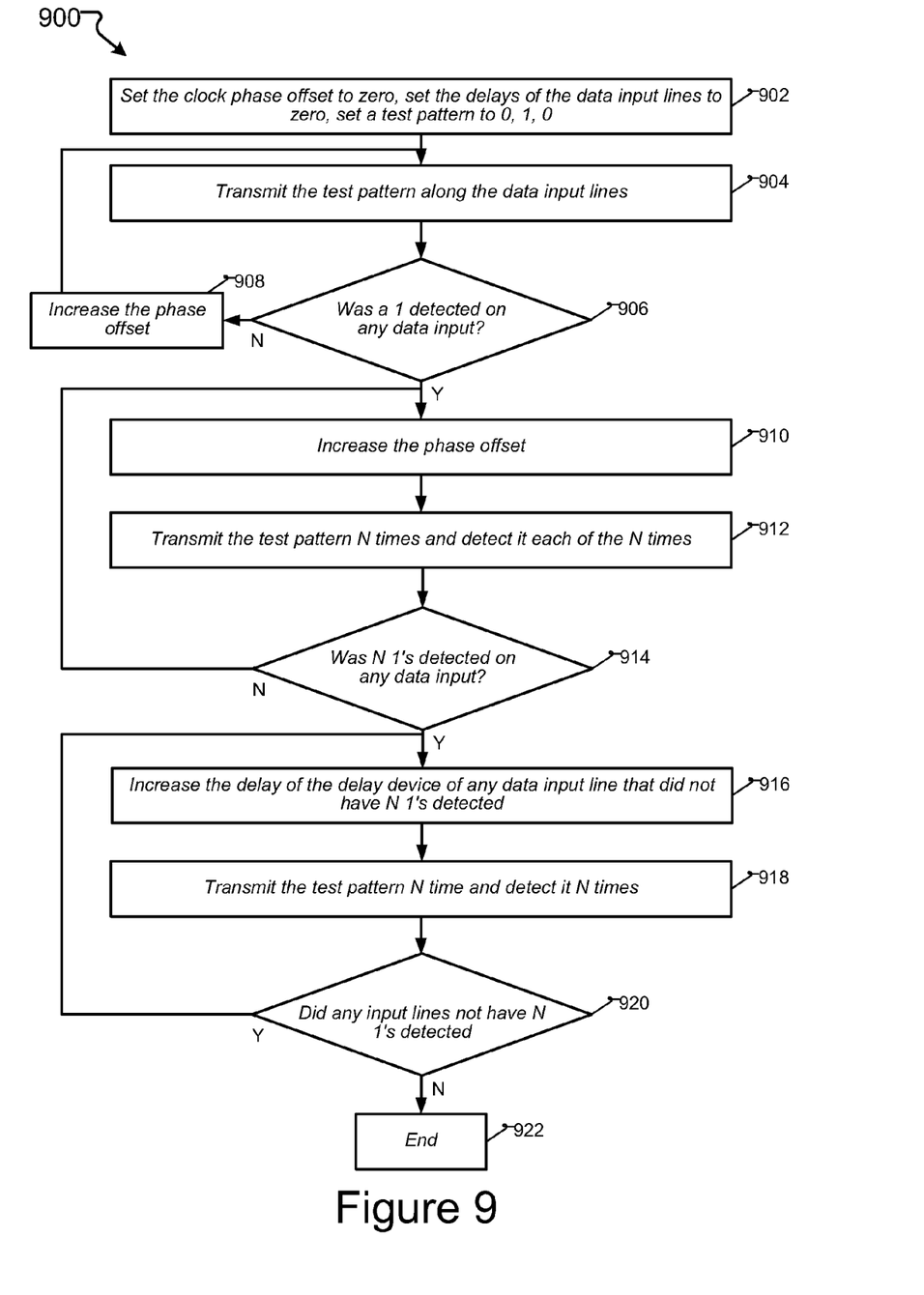
FIG. 9 is a flowchart of another method of aligning data inputs of a system component in accordance with some embodiments of the present invention.

FIG. 9 illustrates a more specific method 900 for aligning data inputs of a system component in an electronics system. In step 902 of the method 900, the clock phase offset 319 is set to zero, the delays of the delay devices 112 of each data input line 104 is set to zero, and the test pattern is set to 0, 1, 0. Other such test patterns couple be used. In step 904, the test pattern is transmitted along each of the data input lines 104. In step 906, it is detected if a 1 was detected on any data input of the register 304 of the system component 102. In some configurations, the controller 302 makes this determination. If no 1 was detected, in step 908, the phase offset is increases and steps 904 and 906 are repeated. If a 1 was detected, in step 910, the phase offset is increased.

In step 912, the test pattern is transmitted N times and detected N times. In step 914, it is determined if N 1's was detected on any data input during the N times the test pattern was transmitted in step 912. If not, steps 910, 912, and 914 are repeated. If so, in step 916, the delay of the delay device of any data input line that did not have N 1's detected is increased. In step 918, the test pattern is again transmitted N times and detected N times. In step 920, it is determined if any input lines did not have N 1's detected. If so, steps 916, 918, and 920 are repeated. If not, the method 900 is ended.

In some configurations, the method 900 is again repeated, but with the test pattern of 0, 1, 0 and the method detecting 0's and N 0's. After this second instance of the method 900, the delay of each data input line 104 can be averaged with that of the first instance of the method 900 and the delay of each delay device 112 of each data input line 104 set to the averaged value.

Thus, as discussed herein, embodiments of the present invention embrace data input alignment systems and methods for aligning data inputs of a system component in an electronics system.

Returning to FIG. 3, after each of the individual delay devices 112 is configured to align the input data, a phase offset can be configured to adjust the arrival time of the group of data input lines 104 so that the data input lines meet the setup and hold requirements of the system component 102. The VCO 312 can be coupled the data input lines 104 and receive a clock signal from clock line 316. In some embodiments, the controller 302 or another component of the system 300 is configured to adjust the phase offset of the VCO 312 to adjust the timing of each of the data input lines 104 as a group so that they meet the setup and hold times of the system component 102. This may be done by varying the timing or the phase of the output signals sent from the VCO 312.

Figure 10:
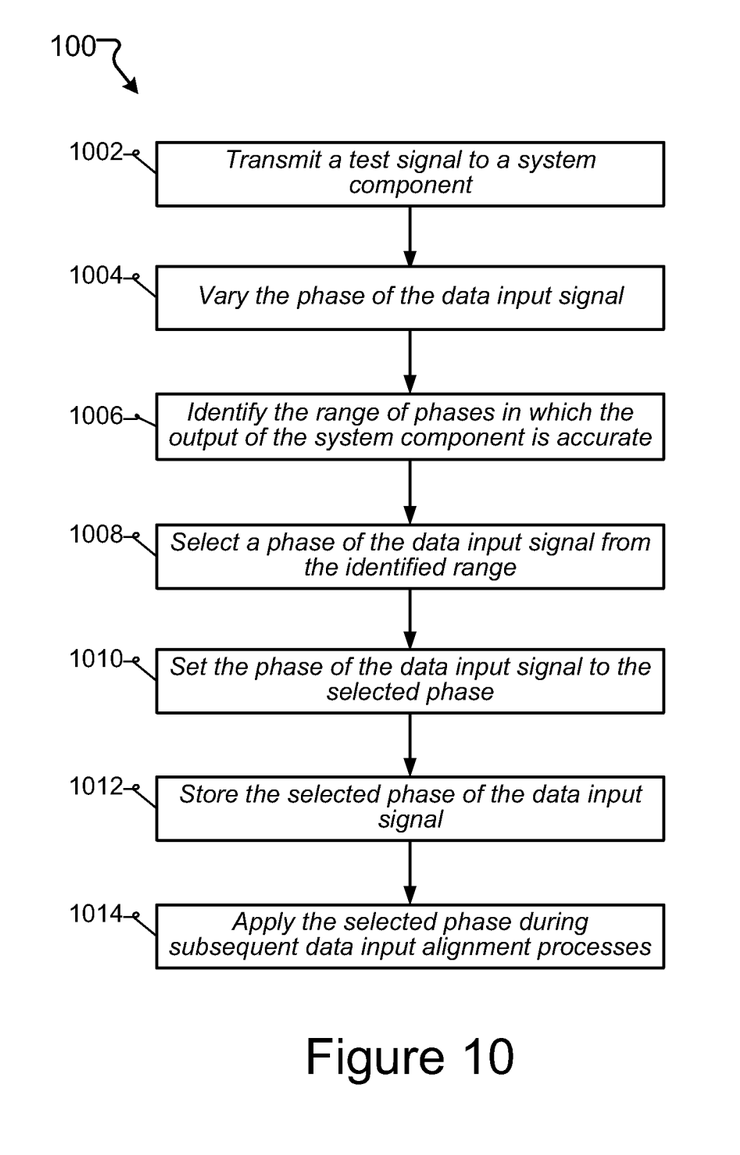
FIG. 10 is a flowchart of a method of offsetting a clock signal in accordance with some embodiments of the present invention.

FIG. 10 illustrates a flowchart of a method 1000 for identifying an acceptable offsetting of the data input signals. As shown in step 1002, a test signal is transmitted to the system component 102 from the VCO 312. Various test signals can be utilized. In some instances, the test signal is a digital sine wave. Accordingly, the test signal can be a repeating signal or be repeatedly transmitted. In step 1004, while the test signal is being transmitted, the phase of the signal transmission from the VCO 312 is varied. In step 1006, the range of the phases of the VCO 312 outputs in which the system component 102 outputs are within an acceptable range of accuracy based on the repeating test signal is identified. This identification can include a fully automatic, semi-automatic, or manual identification. The measure for the acceptable range of accuracy can be preconfigured in the controller 302 or another system component. In step 1008, once the range of the acceptable phases are identified and a phase is selected from within the range. This phase can be at the middle of the acceptable range or at another such predetermined point. In step 1010, the phase offset of the VCO 312 is set to the selected phase. Optionally, in some configurations, in step 912, the selected phase is stored in the system 300. And, in step 1014, the stored selected phase is accessed and applied during a subsequent alignment process. In this way, an acceptable clock phase does not have to be recalculated during each alignment process.

Thus, as discussed herein, embodiments of the present invention embrace methods for providing an offset clock in combination with aligning data inputs of a system component in an electronics system.

Figure 11:
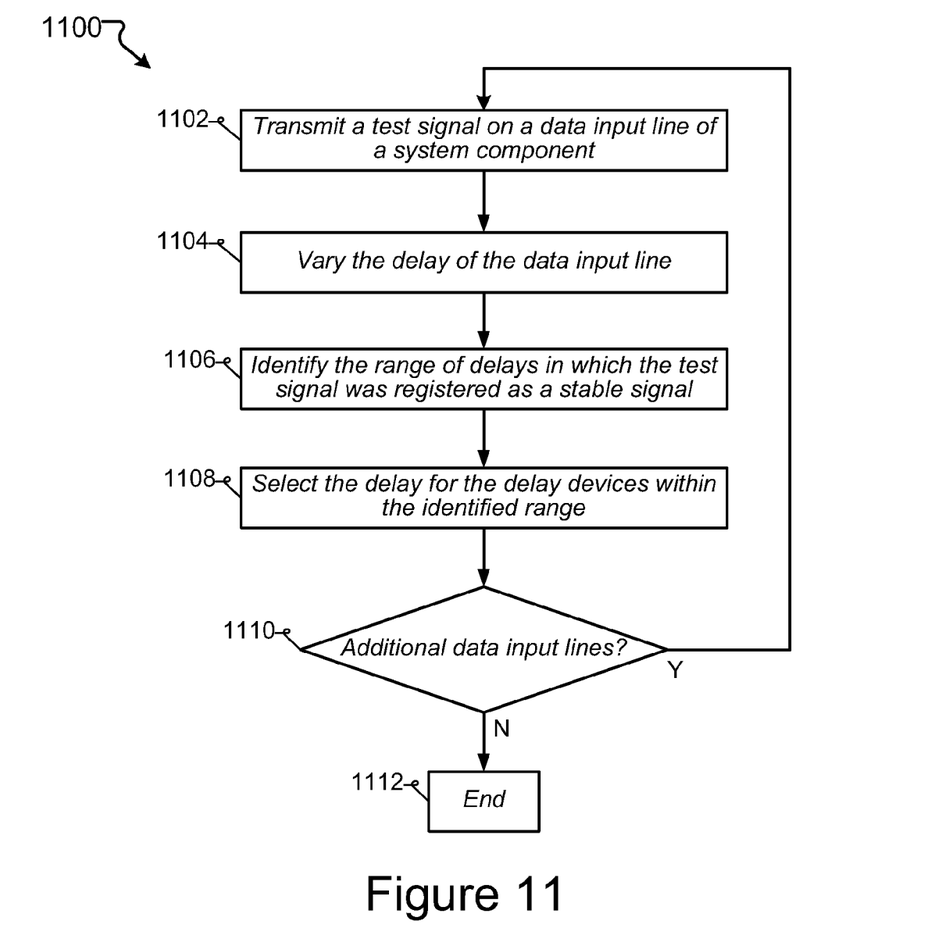
FIG. 11 is a flowchart of another method of aligning data inputs of a system component in accordance with some embodiments of the present invention.

Reference will now be made to FIG. 11, which depicts an alternative data input alignment method 1100. As shown, in step 1102, a test signal is transmitted on a data input line 104 of a system component. In some instance, the test signal is a single bit pulse signal, as described above. In other instances, the test signal is relayed from the system clock, such as along clock line 316 of FIG. 3. In step 1104, the delay of the delay device 112 of the data input line 104 is varied along a range as the test signal is repeatedly transmitted on the data input line 104. This range can be approximately one or more clock cycles. In some configurations, the delay of the delay device 112 is varied by the controller 302. In step 1106, the range in which the test signal is registered as a stable signal during a predetermined clock signal is identified. In step 1108, a delay for the delay device 112 of that data input line 104 is selected. This optimal delay can be at anywhere within this range. However, in come configurations, the delay is selected as in the middle of this range or at a point ⅕ from the start of this range, where the signal is likely to be more stable and a sufficient hold time is provided with the remaining ⅘ of the signal. In step 1110, it is determined if there are additional data input lines. If so, steps 1102, 1104, 1106 and 1110 are repeated for each of the data input lines of the system component. If not, in step 1112, the process is ended.

Thus, as discussed herein, embodiments of the present invention embrace an alternative method for aligning data inputs of a system component in an electronics system.

While a number of illustrative applications have been described, many other applications of the presently disclosed techniques may prove useful. Accordingly, the above-referenced arrangements are illustrative of some applications for the principles of the present invention. It will be apparent to those of ordinary skill in the art that numerous modifications can be made without departing from the principles and concepts of the invention as set forth in the claims.

We claim:

1. A method of utilizing a test signal comprising periodically repeating test values to align data inputs of a system component in an electronics system, the method comprising:
    setting the electronics system so that the periodically repeating test values of the test signal provided through input lines to the data inputs of the system component arrive and remain present at the data inputs only during non-registering time periods relative to a clock signal, wherein during the non-registering time periods, the test values of the test signal are not clocked into a register in the system component from any of the data inputs;
    providing the test signal through the input lines to the data inputs;
    after the setting step, adjusting the electronics system until one of the test values of the test signal on one of the input lines arrives and is present at the corresponding one of the data inputs of the system component at a time relative to the clock signal at which the one of the test values is clocked from the corresponding one of the data inputs into the register; and
    after the adjusting step, iteratively increasing a delay of each of the other input lines until another one of the test values of the test signal on each of the other input lines arrives at each of the corresponding other data inputs of the system component at a time relative to the clock signal at which the another one of the test values of the test signal is clocked from the corresponding other one of the data inputs into the register.

2. The method of claim 1, wherein the iteratively increasing step comprises:
    adding a delay to each of the other input lines;
    transmitting the test signal along each of the other input lines;
    determining if the another one of the test values of the test signal on each of the other input lines is clocked into the register;
    increasing the delay of each of the other input lines in which the another one of the test values of the test signal was not clocked into the register; and
    repeating the steps of transmitting, determining, and increasing until the another one of the test values of the test signal sent on each of the other input lines is clocked into the register.

3. The method of claim 2, wherein the transmitting step comprises relaying a clock signal from the system component to each of the input lines.

4. The method of claim 1, further comprising automatically initiating the method of aligning data inputs of the system component upon one or more of power up of the system component, a predetermined change in system temperature, and after a wave form of a signal provided through the input lines to the data inputs of the system component is changed during normal system component operation.

5. The method of claim 1, further comprising configuring a delay device of each of the input lines with a delay that resulted in the another one of the test values of the test signal transmitted on each input line being clocked into the register.

6. The method of claim 1 further comprising providing the clock signal directly to the system component, wherein the clock signal comprises periodically occurring registering and non-registering states, wherein:
    any of the test values at the data inputs are clocked into the register only during the registering states but not during the non-registering states,
    the non-registering time periods correspond to the non-registering states of the clock signal.

7. The method of claim 6, wherein the setting step comprises:
    providing a test clock to a source of the test signal, and
    setting a phase of the test clock so that the test values of the test signal arrive and are at all of the data inputs during one of the non-registering states of the clock signal.

8. The method of claim 7, wherein the adjusting step comprises changing the phase of the test clock until the one of the test values of the test signal arrives at the corresponding one of the data inputs during one of the registering states of the clock signal.

9. The method of claim 6, wherein the adjusting step comprises changing the delay of the one of the input lines until the one of the test values of the test signal arrives at the corresponding one of the data inputs during one of the registering states of a system clock signal.

10. The method of claim 1, wherein the iteratively increasing step comprises:
   increasing by a same delay increment the delay of each of the other input lines while maintaining the delay of the one of the input lines,
   thereafter determining whether the another one of the test values of the test signal on any of the other input lines is clocked into the register, and
   thereafter increasing by a same delay increment, the delay of any of the other input lines from which the another one of the test values of the test signal was not clocked into the register while maintaining the delay of any of the other input lines from which the another one of the test values of the test signal was clocked into the register.

11. The method of claim 10, wherein the iteratively increasing step further comprises repeating the determining step and the second increasing step until the another one of the test values of the test signal has been clocked into the register from each of the other data inputs.

12. The method of claim 1 further comprising activating a scan line from the register, wherein the scan line is an output from the system component, and the adjusting step comprises:
   while performing the providing step and the scan line is activated, monitoring the scan line output from the system component for the one of the test values of the test signal clocked into the register from the corresponding one of the data inputs, and
   adjusting a delay of the one of the input lines until detecting the one of the test values of the test signal from the one of the input lines on the scan line output from the system component.

13. The method of claim 12, wherein the iteratively increasing step comprises:
   while performing the providing step and the scan line is activated, monitoring the scan line output from the system component for the another one of the test values of the test signal clocked into the register from each of the other input lines, and
   adjusting a delay of each of the other input lines until detecting the another one of the test values of the test signal from the other input line on the scan line output from the system component.

14. An electronics system comprising:
   a system component having a clock input and two or more data inputs, the system component configured to clock signals at the data inputs into an internal register during registering states but not during non-registering states of a system clock signal at the clock input;
   a test signal source configured to output a test signal comprising a periodically repeating test state;
   input lines connecting the output of the test signal source to each of the data inputs, each input line comprising a delay device; and
   a controller configured to:
      set the test signal source or the delay devices so that each periodically repeating test state of the test signal arrives and remains present at the data inputs only during one of the non-registering states of the clock signal at the clock input,
      thereafter adjust the test signal source or the delay devices so that a test state of the test signal arrives at one of the data inputs during one of the registering states of the system clock signal, and
      thereafter iteratively increase a delay of ones of the delay devices until a test state of the test signal arrives at each of the other data inputs during one of the registering states of the system clock signal.

15. The electronic system of claim 14, wherein the system component is a DAC.

16. The electronic system of claim 15, wherein the two or more data inputs are disposed in parallel, and the DAC further including a serial output.

17. The electronic system of claim 14, wherein the test signal is a pulse signal.

18. The electronics system of claim 14, wherein:
   the test signal source comprises a test clock input and is configured to output the test signal in accordance with a phase of a test clock signal at the test clock input, and
   the controller is further configured to adjust the test signal source by changing the phase of the test clock signal until a test state of the test signal arrives at the one of the data inputs during one of the registering states of the system clock signal.

19. The electronics system of claim 14, wherein:
   the test signal source comprises a test clock input and is configured to output the test signal in accordance with a phase of a test clock signal at the test clock input, and
   the controller is further configured to set the test signal source by setting the phase of the test clock signal so that the test states of the test signal arrive at the data inputs of the system component during one of the non-registering states of the system clock signal.

20. The electronics system of claim 14 further comprising a scan line from the internal register, wherein:
   the scan line is an output from the system component, and
   the controller is further configured to monitor the scan line output from the system component for the test signal clocked into the register from each of the data inputs.

* * * * *